United States Patent [19]

Fargette et al.

[11] Patent Number: 5,016,978
[45] Date of Patent: May 21, 1991

[54] MAGNETICALLY CONTROLLED OPTICAL SWITCH

[76] Inventors: Alain Fargette, 3, Rue Nungesser, FR-93150, Le Blanc-Mesnil; André Marland, 35, Avenue Chevreul, FR-92270, Bois-Colombes; Fabrice Thomas, 28, Rue Taine, FR-75012, Paris; Alain Souloumiac, 38, Avenue du Presidente Allende, FR-93100, Montreuil, all of France

[21] Appl. No.: 350,733
[22] PCT Filed: Jul. 29, 1988
[86] PCT No.: PCT/FR88/00394
  § 371 Date: Mar. 28, 1989
  § 102(e) Date: Mar. 28, 1989
[87] PCT Pub. No.: WO89/01173
  PCT Pub. Date: Feb. 9, 1989

[30] Foreign Application Priority Data

Jul. 31, 1987 [FR] France ................. 87 10880

[51] Int. Cl.⁵ .................... G02B 26/02; G02B 6/02; G02B 26/00
[52] U.S. Cl. .................... 350/269; 350/266; 350/96.29; 350/359
[58] Field of Search ............ 350/266, 269, 96.2, 350/96.21, 96.29, 359

[56] References Cited

U.S. PATENT DOCUMENTS

| 3,787,837 | 1/1974 | Allen et al. ............... 340/365 |
| 3,963,326 | 6/1976 | Buchert ...................... 350/266 |
| 4,060,313 | 11/1977 | Kondo ........................ 350/269 |
| 4,376,566 | 3/1983 | Blackington ............... 350/96.2 |

FOREIGN PATENT DOCUMENTS 0115126 8/1984 European Pat. Off. .

Primary Examiner—Paul M. Dzierzynski
Assistant Examiner—James Phan
Attorney, Agent, or Firm—Eckert Seamans Cherin & Mellott

[57] ABSTRACT

An optical switch comprising a base (1) having a light path (4, 5) passing therethrough, a guide slot (6) intersecting said path, a moving shutter (24) displaceable at least partially inside said guide slot (6) between a position where it allows light to pass along said path and a position where it interrupts said passage, and a return spring (22) for the shutter, the switch being characterized in that said shutter (24) and said spring (22) constitute portions of a deformable blade (2), the spring (22) being fixed at one of its ends to the base, and the moving portion of said blade having a surface (21) which is large enough to be capable of responding to magnetic attraction exerted against the action of said spring.

9 Claims, 3 Drawing Sheets

MAGNETICALLY CONTROLLED OPTICAL SWITCH

BACKGROUND OF THE INVENTION

1. Field of the Invention

The present invention relates to a switch having the function of interrupting a light path under the effect of magnetic control.

2. Prior Art

Electricity and electronics are widespread Switches and keyboards have become very numerous in conjunction therewith. Being sensitive to wear, bounce, water, static electricity, and sparking, they are not without operational defects. A magnetically controlled optical switch can avoid them. Enclosed in a sealed box it is insensitive to liquids and to air-borne dirt.

A first implementation of this type of switch is described in French patent application FR-A-2 595 022. It consists in placing a metal ball in a cylindrical hole passing through the middle of the light path. When a magnet is moved close to the ball, the ball rises and either interrupts or else disengages the light path. However, this system suffers from the defect of being sensitive to shock and vibration A second embodiment, eliminating such sensitivity to vibration, is described in the above-mentioned patent application It consists in taking a relatively fine metal blade to constitute a spring which is sensitive to magnetic attraction, and in folding one of the ends of the blade in order to form a shutter for interrupting the light path, with the other end of the blade being fixed to the base of the switch.

As described, this switch does not operate reliably. In an office keyboard having about 100 keys, it has proved practically impossible to ensure that all of the keys are in working condition simultaneously.

In use, the switch includes certain limitations which give rise to friction in the operation of the switch and to the danger of jamming. As described, the shutter tends to describe an arc of a circle in its housing. This means that a wide shutter slot needs to be provided in the switch, and this is detrimental when optical fibers are used to constitute the light path, since the wider the slot, the greater the loss of light. If the slot is made narrower, it is observed that the shutter tends to rub against the edges of one of the fibers and to jam in the switch base.

Document EP-Al-0 115 126 (Frequency Control Products Inc.) describes a switch for single optical fibers. As shown in its FIGS. 5 and 6, this switch comprises a base with a light path going therethrough, together with a guide slot intersecting the path. A larger volume is provided to one side of the guide slot and contains a shaft carrying a pivoting disk. A thin blade extends from the disk into the slot, and depending on the angular position of the disk, the blade either interrupts or does not interrupt the light path.

A magnet is disposed on the other side of the disk and is actuated by a second, moving magnet placed outside the base. A spring returns the blade towards a rest position and an abutment limits the displacement due to the spring. This structure comprises at least five moving parts inside the base, it is complex and it is not suitable for an application which requires a large number of cheap switches, e.g. an office keyboard which generally comprises about 100 keys. In addition, the switch is bulky.

In contrast, the use of an inside magnet and of an outside magnet ensures that the force transmitted is adequate for reliable operation.

SUMMARY OF THE INVENTION

An object of the present invention is to provide a magnetically controlled optical switch with reduced cost, bulk, and number of moving parts, while nevertheless providing reliable optical and mechanical operation.

The present invention provides a magnetically controlled optical switch comprising a base having a light path passing therethrough, a guide slot intersecting said path, a moving shutter displaceable at least partially inside said guide slot between a position where it allows light to pass along said path and a position where it interrupts said passage, and a return spring for the shutter, the switch being characterized in that said shutter and said spring constitute portions of a deformable blade, the spring being fixed at one of its ends to the base, and the moving portion of said blade having a surface which is large enough to be capable of responding to magnetic attraction exerted against the action of said spring.

It is therefore not essential to include an additional magnetized part inside the base, providing the area on which the magnetic field acts is large enough. A single moving part inside the base ensures that the switch operates properly. In addition, by using a fairly large area for the magnetic attraction, a safety margin is obtained with respect to said attraction and it becomes possible to make the blade from materials which have a reputation for being poorly magnetic. It is thus possible to use stainless steel or a filled or metallized plastic, for example, to take advantage of toughness and resistance to corrosion, while keeping enough room inside the switch for the magnetic attraction head whose area may be about one fourth of a square centimeter, for example.

The present invention also provides a method of manufacturing a switch characterized in that said base is formed with said light path in the form of a light duct, said base subsequently being cut through said light duct using a cutting tool which is used simultaneously for forming said guide slot and for polishing the ends of said light duct in order to optimize the passage of light between the two lengths of light duct separated by the tool.

This means that a favorable light budget is obtained since the two lengths of light duct (e.g. an optical fiber) are automatically properly aligned and without any mutual offset. Losses of about 2 dB can easily be achieved, even while leaving considerable safety margins between the ends of the lengths (and thus increasing light losses), for reasons of assembly clearance, and possibly also to increase the reliability and the lifetime of the switch.

DESCRIPTION OF THE DRAWINGS

Various embodiments of this optical switch are described by way of example with reference to the accompanying drawings, in which.

DETAILED DESCRIPTION OF THE PREFERRED EMBODIMENTS

Figure 1:
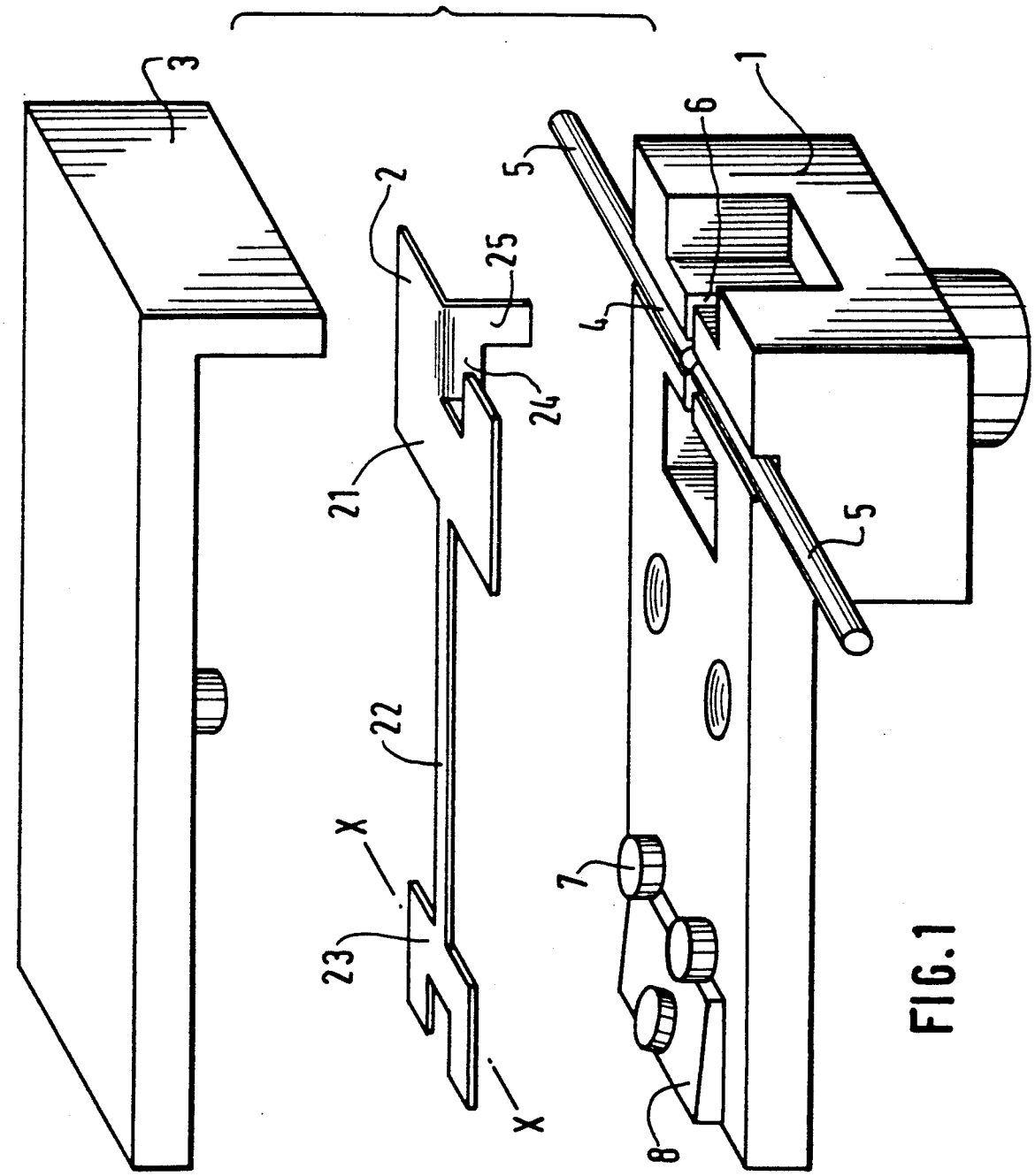
FIG. 1 is an exploded perspective view of the switch.

FIG. 1 is an exploded perspective view of the switch. FIG. 1 shows the three parts of the switch: a base 1, a spring blade 2, and a cover 3.

The base 1 has a channel 4 constituting a groove for a light path. The groove may receive an optical fiber 5 as shown in the example -of FIG. 1. A shutter slot 6 is provided perpendicularly to the light path, in order to receive a shutter 24.

Figure 4:
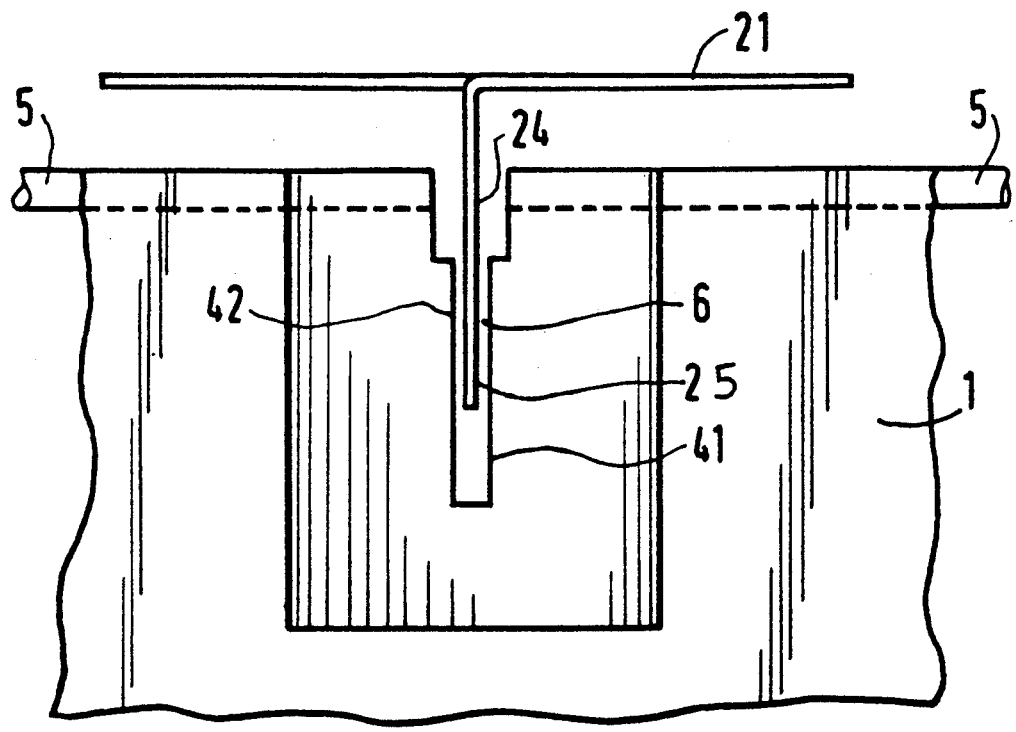
FIG. 4 is an end view of the guide slot.

This slot is shown in detail in FIG. 4. The shutter slot 6 comprises a portion 41 which is deeper than the groove 4, thereby enabling a mechanical guide 25 to be added to the shutter. When using a fiber, the shutter slot 6 should be as narrow as possible in order to limit light losses due to the trajectory of the light through the air.

At the back of the base 1 there are fixing and positioning studs 7 for the spring 22 of the spring blade 2, and the shutter 24. A slope 8 may be provided to cause the spring to bear against the base with a certain amount of force when in the rest position.

The spring blade 2 shown in FIG. 1 has a spring 22 of the rectilinear type. It is formed in a deformable blade which has three portions. The first portion constitutes the magnetic attraction head or surface 21. It must be large enough compared with the spring as a whole to enable the magnetic force to counterbalance the spring force.

This is a fundamental point for operating the shutter. The magnetic attraction head or surface 21 may be made of the same material as the spring 22. Certain types of stainless steel have been found to be sufficiently sensitive to magnetic attraction. The use of such a material may be preferred for its long-life qualities.

The second portion of the spring blade 2 may be a rod which constitutes the spring 22 per se, and it is as fine as possible. The end 23 which may be a segment of the blade 2, is the anchor portion of the spring, and it is designed so as to facilitate positioning the part, e.g. it may be U-shaped.

In the example described, the shutter 24 is a part of the surface 21. In the prior art, the shutter is parallel to the axis X about which the rotary motion of the head takes place. This gives rise to sideways motion of the shutter which is detrimental to proper operation of the switch.

In contrast, in accordance with the invention, the shutter is generally perpendicular to said axis X, thereby avoiding any sideways motion which could give rise to jamming or friction, and also making it easier to position the shutter on the base during manufacture. Providing the shutter 24 is substantially wider than the light path which it interrupts, the distance between the shutter and the fixing point of the spring does not require very close tolerances.

The shutter may be extended by a guide 25 which prevents the shutter from rubbing against the polished faces of the fibers, with the guide slot 41 being narrower than the shutter slot 42 (FIG. 4). The shutter 24 may be made of the same material as the surface 21 of the spring and may be obtained merely by folding after appropriate cutting out.

Figure 3A:
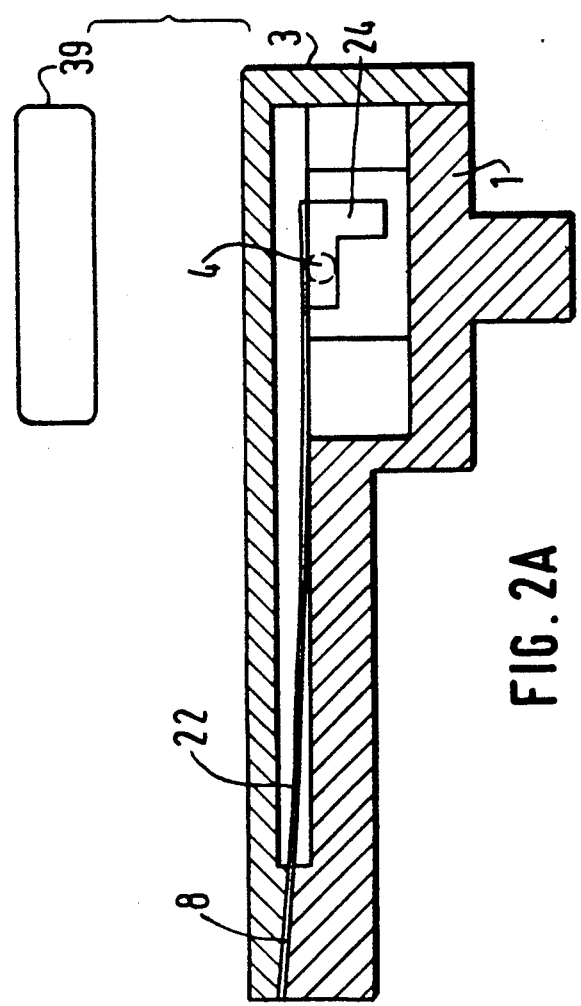
FIGS. 3A and 3B are side views in section through a variant of the switch, respectively in a working position and in a rest position.
Figure 3B:
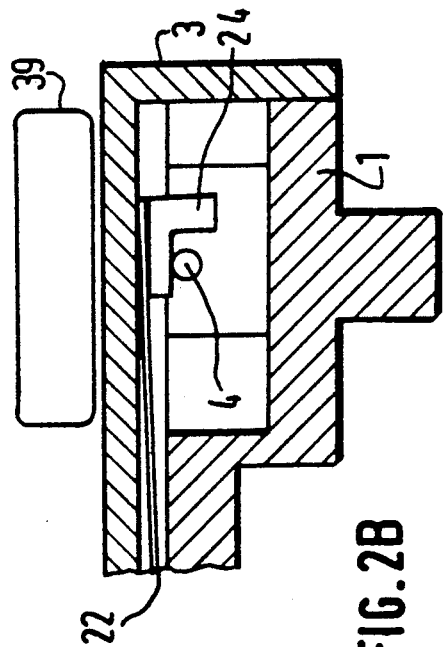

A window 31 may be provided therein (FIGS. 3A and 3B) so that light can pass in the rest position with the light being interrupted when the shutter is raised under the effect of magnetic attraction.

Figure 2A:
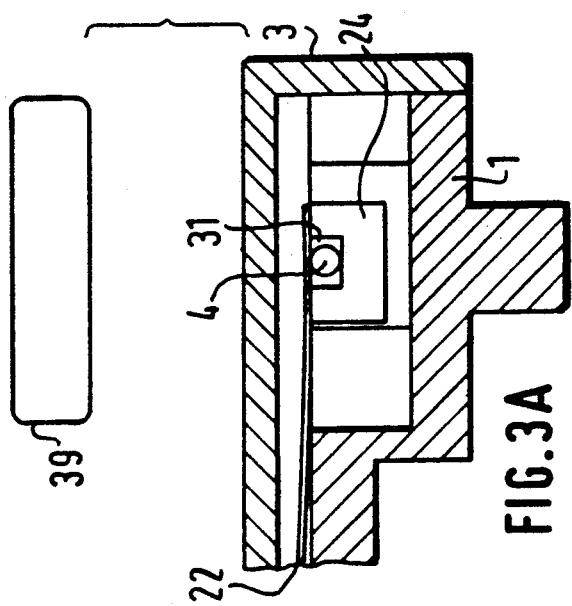
FIGS. 2A and 2B are side views in section through the switch respectively in a working position and in a rest position.
Figure 2B:
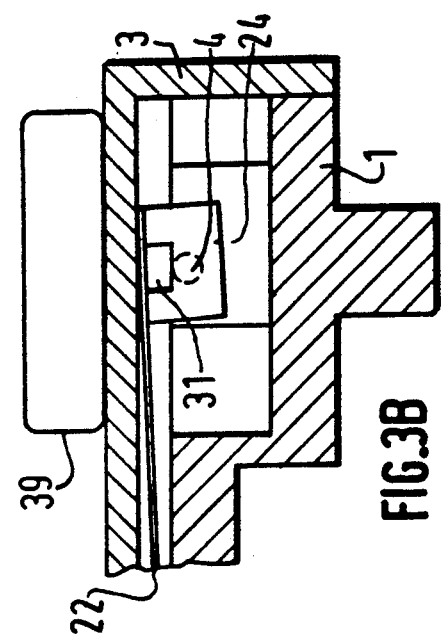

FIGS. 2A and 2B show the two states of the switch: off (FIG. 2A) and on (FIG. 2B) due to the effect of magnetic attraction coming from a moving magnet 39.

The spring may be slightly curved, or the base 1 may include a section of raised slope 8 (FIGS. 1 and 2A) for receiving the end 23 of the spring 22, thereby increasing the return force on the shutter in the rest position. This provides two advantages: it increases switch insensitivity to shock and vibration, and it also tends towards a toggle system with the shutter passing more suddenly from a working position to a rest position under the effect of magnetic control.

Figure 5:
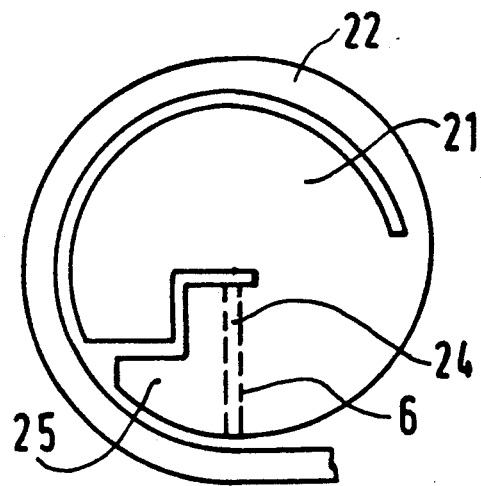
FIG. 5 shows another embodiment of the spring of the switch, seen from above.

Naturally, other forms of spring and shutter may be designed. In order to reduce the size of the switch, the portion 22 of the spring may surround the magnetic surface 21. In this case, the spring surrounding the surface 21 may be circular, rectangular, or spiral in shape, e.g. as shown in FIG. 5. This figure shows the same elements as can be seen in FIG. 1: the fold for forming the shutter 24, the guide extension 25; and the spring arm 22. Since the spring is of a different type, the box must be redesigned accordingly. FIG. 5 shows only one spring arm 22 for a shutter. It would, nevertheless, be possible to provide two or even more arms based on the methods used for loudspeakers, for example.

The box cover 3 acts as an abutment and determines the stroke of the shutter. It may be designed to be sufficiently well sealed to be embedded in a settable mass in order to protect the optical components.

In order to manufacture switches having fibers, it appears preferable, regardless of the type of box used, to cut the fiber inside the switch. This makes it possible to minimize light losses, since the two pieces of fiber are necessarily positioned face-to-face, by virtue of being cut in situ.

The base of the switch may contain a guide slot for the shutter and a holding groove for holding the optical fiber passing therethrough. The fiber is placed in the holding groove and it is cut along the guide slot. The top of the guide slot may be widened a little by the cutting tool, thereby creating a shutter slot which is wider than the guide slot per se, thus avoiding detrimental friction as described above.

Alternatively, the base does not contain a prior guide slot, and the slot is made simultaneously with the cutting of the fiber or other solid light duct.

The above description relates to simple switches having a single optical path constituted by an optical fiber and a single moving blade which interacts with the light as a shutter. This makes the invention easy to understand, and switches as described are useful in assemblies such as office keyboards. However other, more complex structures and functions are also possible.

A single blade may interact with two or more light paths. By suitably placing a window in the blade, one light path may be interrupted while the other is passing light, and vice versa.

The light paths may be empty (or air-containing) tubes, or they may be constituted by various forms of light duct other than optical fibers. For example, the base may be manufactured in an optical plate having light ducts formed therein by doping the plate so as to modify its refractive index locally.

A single plate may constitute the base for a plurality of switches, and indeed for all of the switches of an office keyboard.

A single shutter blade may interact with light paths in a T-shaped configuration. If the shutter is reflective and if it is properly positioned (at about 45° relative to each branch of the T), then the switch may function as a changeover switch. For example, light coming from the left may either continue to travel straight ahead to the right, or else it may be deflected downwards, depending on the position of the shutter. Such an assembly may be highly advantageous in an application other than office keyboards but which nevertheless requires a large number of switches, namely: telecommunications signal switching.

It is possible to combine the functions of a switch per se and of a connector. For example, a switch base may include two connectors for receiving respective lengths of optical fiber, and may thereby mechanically interconnect the lengths while simultaneously passing light or preventing light from passing, at will.

Applications can be found for reliable and cheap optical switches in controlling electrical circuits from dangerous locations, not only in industry, but also in the home, e.g. from bathrooms.

We claim:

1. An optical switch comprising:
   a base receiving at least one optical fiber, the base defining a light path across which light from the optical fiber passes, and a guide slot intersecting said light path;
   a movable shutter displaceable at least partially inside said guide slot between a position where the shutter allows light to pass along said light path and a position where the shutter interrupts said passage of the light, and a return spring for the shutter; and, wherein said shutter and said spring constitute portions of a deformable blade, the return spring being fixed at one of its ends to the base, and a moving portion of said blade having a surface which is large enough to be capable of responding to magnetic force exerted against the action of said spring.

2. A switch according to claim 1, in which said spring imparts a rotary component to movement of the shutter, and wherein said shutter is oriented generally perpendicularly to an axis of said rotary component, so that said shutter moves in a single plane.

3. An optical switch comprising:
   a base receiving at least one optical fiber, defining a light path passing therethrough, and a guide slot intersecting said light path;
   a movable shutter displaceable at least partially inside said guide slot between a position where the shutter allows light to pass along said light path and a position where the shutter interrupts passage of the light, and a return spring for the shutter, said shutter and said spring constituting portions of a deformable blade, the return spring being fixed at one of its ends to the base, and a moving portion of said blade having a surface which is large enough to be capable or responding to magnetic force exerted against the action of said spring, the shutter carrying an element constituting a guide extension which remains engaged in said guide slot when the shutter arrives at one end of its stroke.

4. A switch according to claim 1, wherein said spring is in the form of a generally rectilinear arm.

5. An optical switch comprising:
   a base receiving at least one optical fiber, defining a light path passing therethrough, and a guide slot intersecting said light path;
   a movable shutter displaceable at least partially inside said guide slot between a position where the shutter allows light to pass along said light path and a position where the shutter interrupts passage of the light, and a return spring for the shutter, said shutter and said spring constituting portions of a deformable blade, the return spring being fixed at one of its ends to the base, and a moving portion of said blade having a surface which is large enough to be capable of responding to magnetic force exerted against the action of said spring, the spring being in the form of at least one arm which at least partially surrounds the surface.

6. A switch according to claim 1, wherein said spring is prestressed so as to exert a degree of thrust against said base.

7. A switch according to claim 1, wherein the spring is a stainless steel.

8. A switch according to claim 1, wherein a window is provided in said shutter in order to pass light in one of said positions.

9. A method of manufacturing a switch having a base receiving at least one optical fiber, defining a light path passing therethrough, and a guide slot intersecting said light path; a movable shutter displaceable at least partially inside said guide slot between a position where the shutter allows light to pass along said light path and a position where the shutter interrupts passage of the light, and a return spring for the shutter, said shutter and said spring constituting portions of a deformable blade, the return spring being fixed at one of its ends to the base, and a moving portion of said blade having a surface which is large enough to be capable of responding to magnetic force exerted against the action of said spring, comprising the steps of:
   forming said base with the light path, said light path being in the form of a light duct;
   subsequently cutting said base through said light duct using a cutting tool which is used simultaneously for forming said guide slot and for cutting the light duct.

* * * * *